United States Patent
Lee et al.

(10) Patent No.: US 12,136,905 B2
(45) Date of Patent: Nov. 5, 2024

(54) ELECTROMAGNETIC RADIOFREQUENCY TRAP

(71) Applicant: Microsoft Technology Licensing, LLC, Redmond, WA (US)

(72) Inventors: Jaejin Lee, Beaverton, OR (US); Donghwi Kim, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 235 days.

(21) Appl. No.: 17/943,770

(22) Filed: Sep. 13, 2022

(65) Prior Publication Data
US 2024/0088858 A1    Mar. 14, 2024

(51) Int. Cl.
*H03H 1/00* (2006.01)
*H03H 7/01* (2006.01)

(52) U.S. Cl.
CPC ........ *H03H 1/0007* (2013.01); *H03H 7/0115* (2013.01); *H03H 7/0153* (2013.01); *H03H 7/1758* (2013.01)

(58) Field of Classification Search
CPC .. H03H 1/0007; H03H 7/0115; H03H 7/0153; H03H 7/1758; H04B 15/02; H03B 3/30
USPC .................................... 333/12, 175
See application file for complete search history.

(56) References Cited

U.S. PATENT DOCUMENTS

| | | | |
|---|---|---|---|
| 4,634,930 A | 1/1987 | Toshiyasu et al. | |
| 7,786,621 B2* | 8/2010 | Joodaki | H04B 15/04 307/91 |
| 9,025,803 B2 | 5/2015 | Sacha | |
| 9,853,546 B2 | 12/2017 | Kim et al. | |
| 11,108,602 B2* | 8/2021 | Alkan | H01F 17/062 |
| 11,221,386 B2 | 1/2022 | Rearick et al. | |

(Continued)

FOREIGN PATENT DOCUMENTS

| CN | 107959412 A | 4/2018 |
|---|---|---|
| CN | 105932787 B | 10/2018 |

(Continued)

OTHER PUBLICATIONS

International Search Report and Written Opinion received for PCT Application No. PCT/US23/027979, mailed on Nov. 17, 2023, 13 pages.

*Primary Examiner* — Hai L Nguyen
(74) *Attorney, Agent, or Firm* — Holzer Patel Drennan

(57) ABSTRACT

A radiofrequency trap component system includes a resonant LC circuit including a capacitive element and an inductive element, wherein the inductive element includes primary inductor rings positioned in proximity to a modulation ring. The radio frequency trap component system further includes a radiofrequency noise detector configured to detect a noise level of radiofrequency noise interacting with an electromagnetic radiofrequency noise recipient in a computing device and controller circuitry communicatively coupled to the radiofrequency noise detector and configured to determine that the detected noise level satisfies an interference condition and to tune a radiofrequency bandwidth at which the resonant LC circuit resonates by modulating electrical current supplied to the modulation ring of the inductive element in the resonant LC circuit, based at least on determining that the detected noise level satisfies the interference condition.

20 Claims, 9 Drawing Sheets

(56) References Cited

U.S. PATENT DOCUMENTS

2008/0224932 A1  9/2008  Suematsu
2010/0148883 A1  6/2010  Bodette

FOREIGN PATENT DOCUMENTS

| EP | 0019437 A1 | 11/1980 |
|---|---|---|
| EP | 1554590 B1 | 1/2009 |
| JP | 2012182877 A | 9/2012 |
| WO | 2017095484 A1 | 6/2017 |
| WO | 2017204663 A1 | 11/2017 |
| WO | 2022052737 A1 | 3/2022 |

* cited by examiner

ELECTROMAGNETIC RADIOFREQUENCY TRAP

BACKGROUND

An electronic computing device typically includes input/output ports, antennas, a display, a power supply circuitry, and other assorted circuitry. Any number of these electronic elements can generate electromagnetic radiofrequency (RF) radiation that can interact with other electronic elements on the computing device.

SUMMARY

The described technology provides a radiofrequency trap component system including a resonant LC circuit including a capacitive element and an inductive element, wherein the inductive element includes primary inductor rings positioned in proximity to a modulation ring. The radio frequency trap component system further includes a radiofrequency noise detector configured to detect a noise level of radiofrequency noise interacting with an electromagnetic radiofrequency noise recipient in a computing device and controller circuitry communicatively coupled to the radiofrequency noise detector and configured to determine that the detected noise level satisfies an interference condition and to tune a radiofrequency bandwidth at which the resonant LC circuit resonates by modulating electrical current supplied to the modulation ring of the inductive element in the resonant LC circuit, based at least on determining that the detected noise level satisfies the interference condition.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Electrical elements (noise source elements) within a computing device (e.g., an electronic device) can generate electromagnetic RF radiation (noise) that can interfere with the performance of other electrical elements (noise recipient elements) within the computing device, particularly with elements including RF antennas. As devices become smaller, these elements tend to be placed in closer proximity to each other, thereby amplifying the risk and impact of such interference. While RF component shielding may be used to block such RF noise between electrical components, such shielding can increase the product weight and volume, impair internal airflow, increase thermal management solution costs and complexity, etc. In addition, imperfect grounding of the shielding can dramatically reduce the effectiveness of such shielding.

It should be understood that a variety of different elements of a computing device may act as a noise source, including I/O ports, internal circuitry, noise-generating interconnect traces, power supply circuitry, etc. It should be understood that a variety of different elements of a computing device may act as noise recipients, including RF antennas, RF sensitive, interconnect traces, RF sensitive components, clock crystals, etc., wherein the performance of the noise recipient is degraded by RF noise emitted by another component of the computing device.

The described technology provides for a configurable electromagnetic RF trap positioned with respect to noise source elements and noise recipient elements. In at least one implementation, an electromagnetic RF trap includes a resonant LC circuitry that can be set to act as a bandstop filter at one or more specified frequencies. An electromagnetic RF trap can be configured for such specified frequencies by the inductance and capacitance used in the LC circuit and can be further configured using inductance modulation of the primary inductive rings (e.g., coils) on the inductive components. Accordingly, the RF trap can be tuned at one or more frequencies to reduce the electric field noise from one electrical element (e.g., an I/O port) interfering with the performance of another electrical element (e.g., an RF antenna, a clock crystal).

Figure 1:
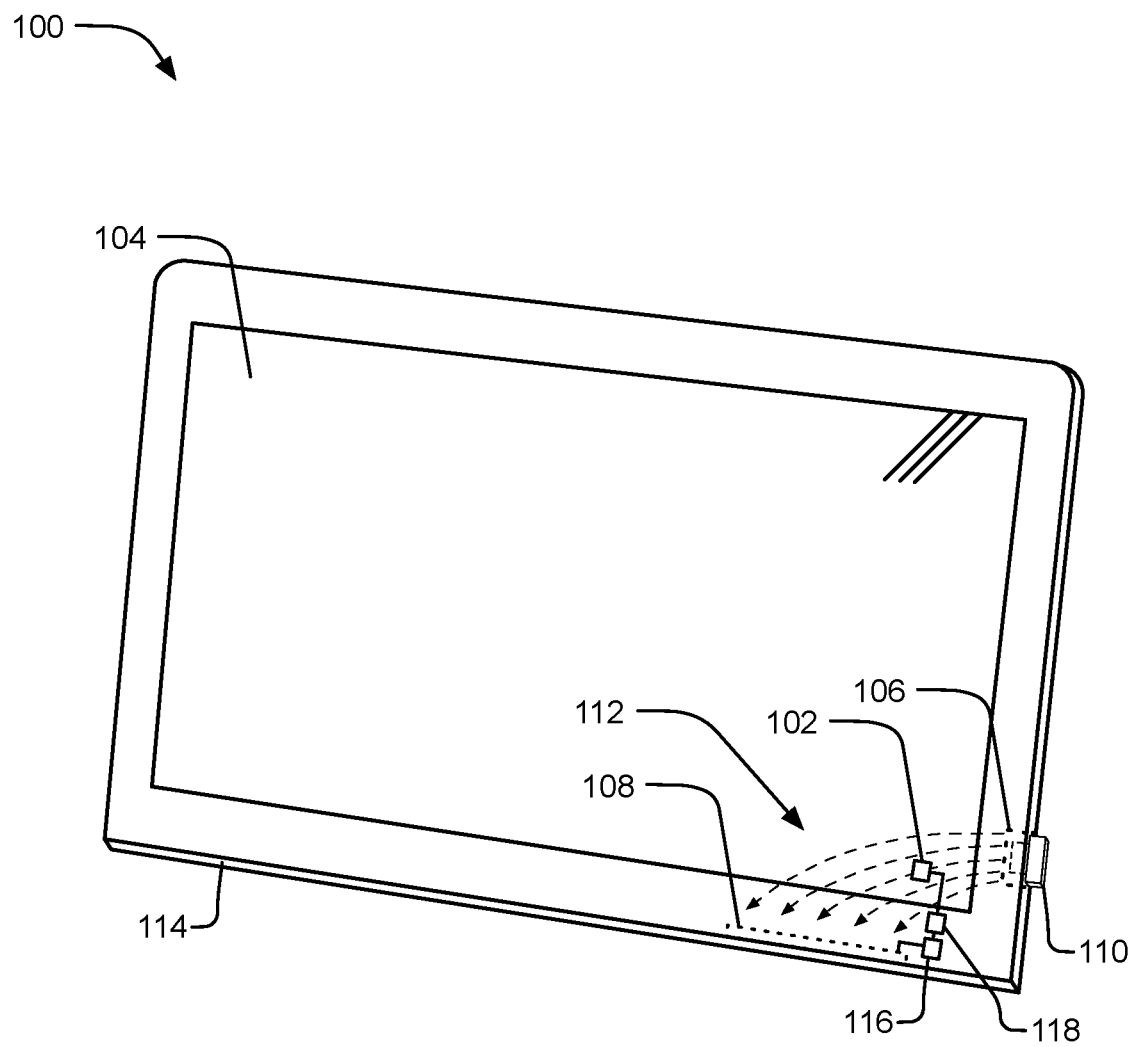
FIG. 1 illustrates an example electronic computing device including an electromagnetic RF trap component system.

FIG. 1 illustrates an example electronic computing device 100 including an electromagnetic RF trap component 102. The electromagnetic RF trap component 102 includes one or more capacitive elements and one or more inductive elements configured as a resonant LC circuit. The inductive element includes primary rings of an inductor and at least one modulation ring positioned in proximity to the primary rings. By modulating the current supplied to the modulation ring, the electronic computing device can change the permeability of the inductive element and therefore adjust the RF trapping bandwidth of the resonant LC circuit in the electromagnetic RF trap component 102.

The electronic computing device 100 includes a display 104, a chassis 114, a USB port 106, and an RF antenna 108. A USB device 110 (e.g., a dongle providing a wireless connection to a mouse) is shown as inserted into the USB port 106, which is a potential source of RF noise 112 that can extend to the RF antenna 108 and negatively impact the performance of the RF antenna 108. When configured for the frequency band of the RF noise 112, the electromagnetic RF trap component 102 can reduce the interference experienced by the RF antenna 108 by the RF noise 112 emitted by the USB port 106. This scenario is further described with respect to FIG. 2.

The electronic computing device 100 also includes a radiofrequency noise detector circuit 116 configured to detect a noise level impacting the RF antenna 108. For example, the radiofrequency noise detector circuit 116 can detect the level of RF noise in the radio channel(s) of a radio module coupled to the RF antenna 108. Other mechanisms for detecting a noise level impacting an RF noise recipient may be employed, including a small separate receiving antenna tunable to detect RF electric field levels at one or more specified RF bandwidths in the proximity of the RF noise recipient.

The radiofrequency noise detector circuit 116 is communicatively connected to controller circuitry 118, which is configured to determine whether the detected noise level (received from the radiofrequency noise detector circuit 116) satisfies an interference condition, and if so, the controller circuitry 118 modulates the alternating current supplied to a modulation ring of the electromagnetic RF trap component 102 to adjust the RF bandwidth of the resonant LC circuit of the electromagnetic RF trap component 102.

It should be understood that the radiofrequency noise detector circuit 116 and/or the controller circuitry 118 may or may not be integrated into the electromagnetic RF trap component 102. As shown in FIG. 1, the radiofrequency noise detector circuit 116 and the controller circuitry 118 are separate elements from the electromagnetic RF trap component 102, positioned within the electronic computing device 100.

Figure 2:
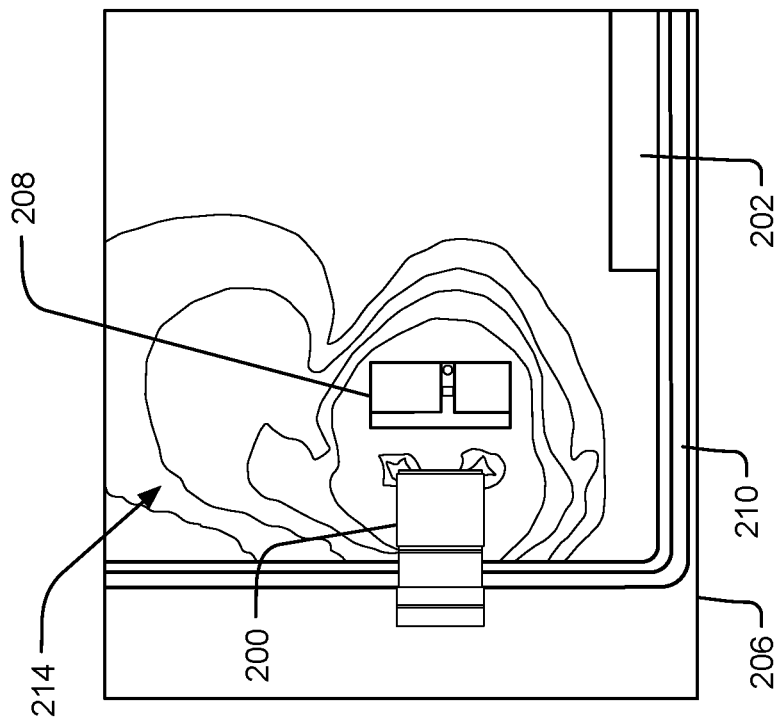
FIG. 2 illustrates example electric field distributions between an RF noise source and an RF antenna in two configurations, one configuration without an RF trap component and the other configuration with an RF trap component.
Figure 2:
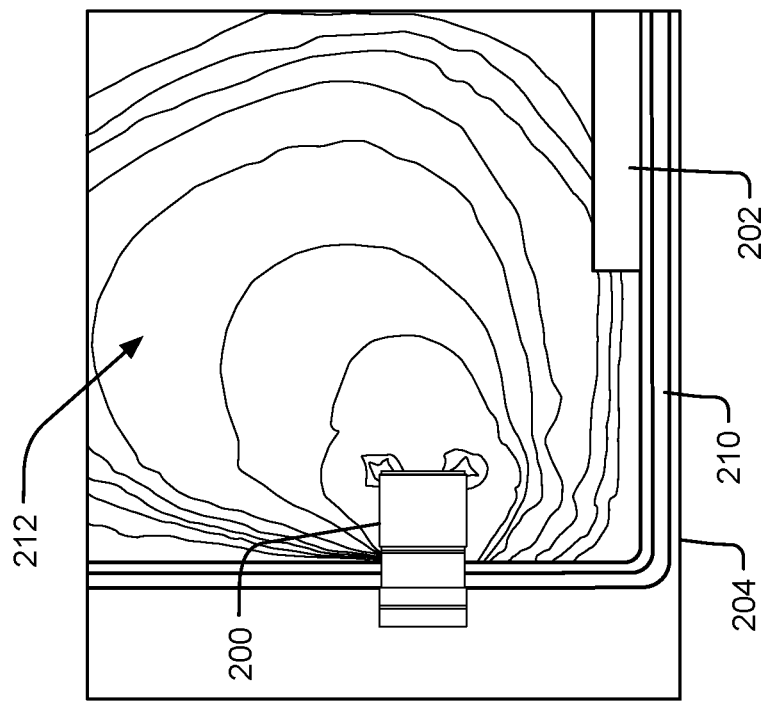

FIG. 2 illustrates example electric field distributions between an RF noise source 200 and an RF antenna 202 in two configurations, one configuration 204 without an RF trap component and the other configuration 206 with an RF trap component 208.

As shown in the configuration 204, the RF noise source 200 (e.g., a USB port in this case) emits an electric field 212 that extends strongly to the RF antenna 202 within the chassis 210 of a computing device and can therefore interfere significantly with the performance of the RF antenna 202. In contrast, as shown in the configuration 206, the RF noise source 200 emits an electric field 214 that is trapped by the RF trap component 208, thereby reducing or eliminating the RF noise impacting the RF antenna 202 within the chassis 210 of a computing device. Accordingly, the RF trap component 208, therefore, protects the RF antenna 202 (noise recipient element) from significant interference by the RF noise emitted from the RF noise source 200 (interfering element).

Placement of the RF trap component 208 (e.g., an RF trap circuitry) with respect to the RF noise source 200 and the RF antenna 202 can influence the effectiveness of the RF trap component 208. In some implementations, placing the RF trap component 208 between the RF noise source 200 and the RF antenna 202 can enhance the effectiveness of the RF trap component 208. Furthermore, the effectiveness of the RF trap component 208 may depend on the distance between the RF trap component 208 and the RF noise source 200 and/or the RF antenna 202 (e.g., the closer to one or the other, the stronger the trapping effectiveness). Nevertheless, even if the RF trap component 208 is not located between (e.g., intersecting an axis between the RF noise source 200 and the RF antenna 202 or between the substantially planar X-axis or Y-axis positions of the source and the recipient), the RF trap component 208 may still reduce the interference between the RF noise source 200 and the RF antenna 202. In one implementation, the RF trap component 208 may be placed within a region of a strong electromagnetic field emitted by the RF noise source 200, such as within a region of less than 3 db drop-off from the maximum noise level emitted by the RF noise source 200. Other drop-off points may be employed to define the threshold of the noise and the placement of the RF trap.

One technical benefit of the use of a noise-threshold-based placement of the RF trap component 208 is that it allows placement of the RF trap component 208 independent of being located between the RF noise source 200 and the RF antenna 202. As such, by placing the region of a strong electromagnetic field from the RF noise source 200, the RF trap can substantially reduce the noise received by the RF antenna 202, even if the RF noise trap component 208 is not placed between RF noise source 200 and the RF antenna 202.

In various implementations, the RF trap component 208 can be configured to trap noise within a specified RF bandwidth, and this configuration can be adjusted as needed to protect the performance of the RF antenna 202. In one implementation, the RF trap component 208 includes a configurable inductive component having primary inductor rings and one or more switchable modulation rings capable of modulating the inductance of the primary rings, thereby changing the tuning of the RF trap component 208 to trap different RF bandwidths. In another implementation, the RF trap component 208 includes a configurable inductive component having primary inductor rings and one or more modulation rings configured to modulate the inductance of the primary rings using a pulse-width-modulated (PWM) signal applied to the one or more modulation rings, thereby changing the tuning of the RF trap component 208 to trap different RF bandwidths. Other adjustable modulation configurations may additionally or alternatively be employed.

A technical benefit of adjusting the RF trapping bandwidth is to tune the trapped noise that is in an RF bandwidth that negatively affects the performance of the RF antenna 202 or another RF antenna in the computing device. Such tuning may be accomplished by switching different connections between inductive elements and/or different connections supplying a signal to a modulation ring, and/or by adjusting the modulation of a modulation ring within one or more of the inductive elements.

In some configurations, different RF antennas operate at different bandwidths. As such, the RF trap component 208 can be tuned to trap RF noise within those different bandwidths. In other implementations, multiple. RF traps can be located within the computing device to trap RF noise in different bandwidths that negatively affect the performance of one or more RF antennas within the computing device.

Through such an adjustable configuration, a controller (e.g., controller circuitry, not shown) can adaptively tune the RF trap component 208 at an RF bandwidth such that the RF antenna 202 can operate at a high signal-to-noise ratio (SNR) in multiple environments (e.g., to optimize the SNR in any given environment). In one implementation, a subset of possible noise conditions can be selectable using a combination of switchable modulation rings in one or more inductive components of the LC resonant circuit in the RF trap component 208. In another implementation, the PWM control of the modulation rings in one or more inductive components of the LC resonant circuit in the RF trap component 208 can provide less discrete (more analog) and less limited adjustments, allowing for a wider range and finer-grained control over the trapped RF bandwidth as compared to some switchable configurations.

Figure 3:
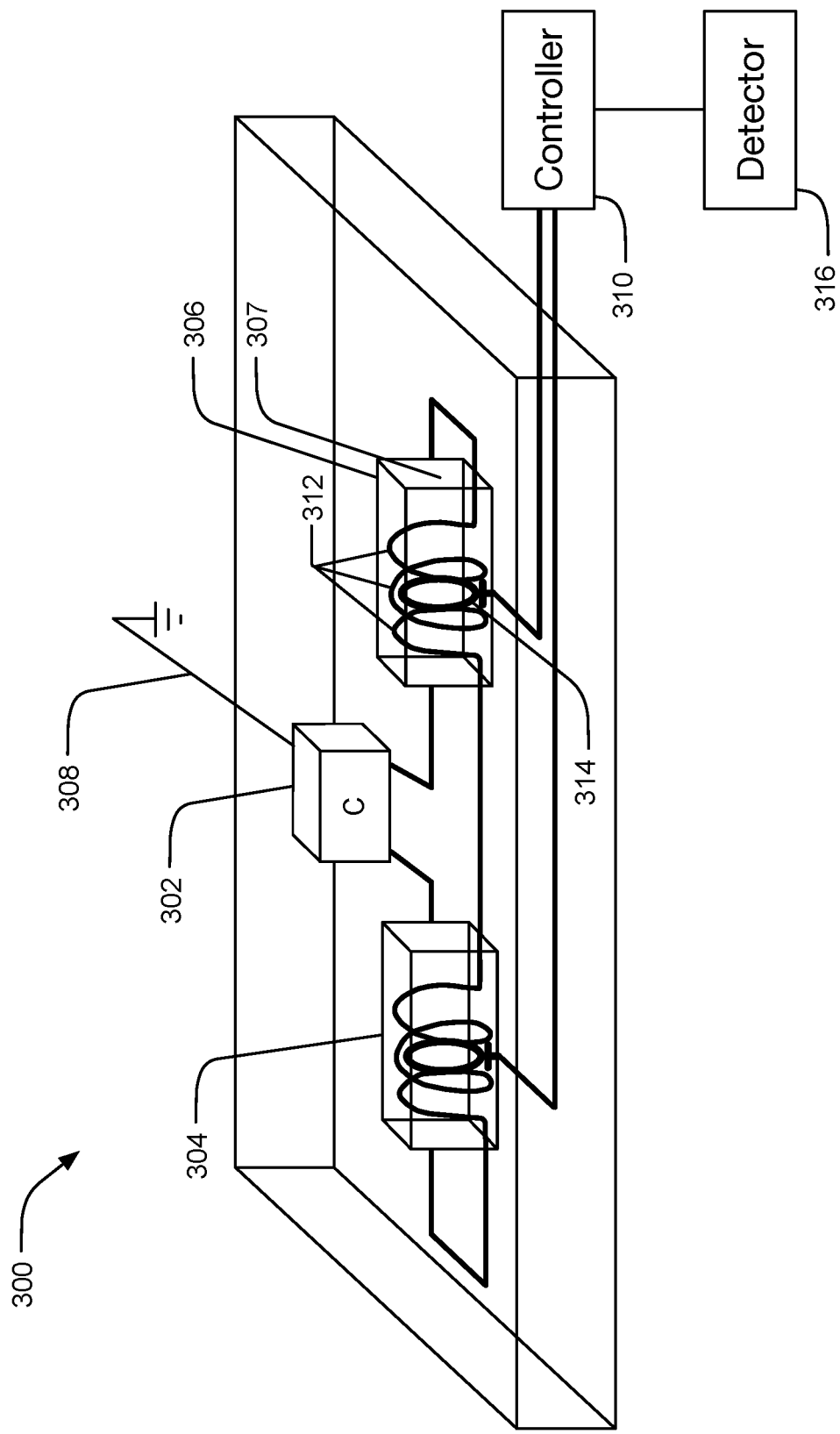
FIG. 3 illustrates example circuitry for a dynamically configurable electromagnetic RF trap component.

FIG. 3 illustrates example circuitry 300 for a configurable electromagnetic RF trap component. The circuitry 300 provides a resonant LC circuit including a capacitive element 302 and two adjustable inductive elements (inductive element 304 and inductive element 306). It should be understood that one or more adjustable inductive elements may be employed in a single RF trap component with varying connections (see, e.g., FIGS. 4-6). In one implementation, one or more capacitive elements (which may or may not include variable capacitors) are connected in parallel with one or more adjustable inductive elements to form the resonant LC circuit, which is electrically grounded (e.g., by one or more electrically grounded traces 308). Alternative implementations of forming a resonant LC circuit may be employed, including multiple inductive elements in parallel with each other. The illustrated LC components and traces of circuitry 300 may be mounted on a substrate or other carrier within the computing device.

Furthermore, the impact of RF noise on an electromagnetic RF noise recipient in the computing device is detected by detector circuit 316. In one implementation, the detector circuit 316 can detect the level of RF noise in the radio channel(s) of a radio module coupled to the electromagnetic RF noise recipient (e.g., an RF antenna). Other mechanisms for detecting a noise level impacting an RF noise recipient may be employed, including detecting a change in a clock frequency generated by a clock crystal and providing a small separate receiving antenna tunable to detect RF electric field levels at one or more specified RF bandwidths in the proximity of the RF noise recipient.

The adjustable inductive elements are connected to the controller circuit 310, which can adjust the inductance of the adjustable inductive elements to turn the elements to a trapped RF bandwidth, based at least in part on the RF noise level detected by the radiofrequency noise detector circuit 116. In one implementation, the controller circuit 310 determines whether the detected RF noise satisfies an interference condition signifying degradation of the performance of the electromagnetic RF noise recipient by the RF noise impacting it. For example, the controller circuit 310 can determine that the level of RF noise interacting with the electromagnetic RF noise recipient exceeds a predetermined threshold and/or is in an RF bandwidth that risks degrading the performance of the electromagnetic RF noise recipient.

In one implementation, if the controller circuit 310 determines that the interference condition is satisfied, the controller circuit 310 tunes the LC resonant circuit of the configurable electromagnetic RF trap component to trap at least some portion of the RF noise by modulating the current supplied to a modulation ring of one or both each inductive element by opening or closing a switch supplying a modulation signal to the modulation ring in the adjustable inductive element. In another implementation, the controller circuit 310 modulates the current supplied to the modulation ring of one or both of each inductive element by adjusting a PWM signal supplied to the modulation in the adjustable inductive element. The current supplied to the modulation ring of an inductive element alters the permeability of the inductive element and therefore alters the inductance of the resonant LC circuit in the configurable electromagnetic RF trap component. These and other configurations, therefore, may be used to adjust the RF bandwidth of noise trapped (e.g., blocked or reduced) by the electromagnetic RF trap component.

Further, the controller circuit 310 and the detector circuit 316 may be mounted on the same substrate or carrier or somewhere else within the computing device.

Tuning the electromagnetic RF trap component using switches and/or modulating the current supplied to a modulation ring of an adjustable inductive allows the system to adjust the RF bandwidth that is trapped by the electromagnetic RF trap component. As such, the tuning provides the technical benefit of adjusting the trapped bandwidth to best protect the RF noise recipient from noise generated by the RF noise source. Furthermore, in one implementation, modulating the supply current provides enhanced granularity and responsiveness of the control applied to the modulation ring. Some switching configurations can be rather discrete while modulation can provide a more precise and responsive control implementation.

In FIG. 3, each adjustable inductive element includes magnetic material (e.g., magnetic material 307), one or more primary rings (e.g., primary rings 312 in the inductive element 306), and one or more modulation rings (e.g., the modulation ring 314 in the inductive element 306). A modulation ring can be modulated by the controller circuit 310 to adjust the permeability of the magnetic material according to the strength of the magnetic field induced by eddy currents (Foucault's currents) in the modulation ring. By Lenz's law, an eddy current in the modulation ring induces a magnetic field that opposes the change in the magnetic field that created it, and thus eddy currents react back on the source of the magnetic field.

For example, in a switched implementation, the modulation ring does not generate a magnetic field ($H_{eddy}=0$) from eddy currents when the modulation ring is switched off (e.g., the switch is open), and therefore there is no magnetic void between the primary rings and the modulation ring. As such, the magnetic field strength and, therefore, the inductance of the primary rings are not substantially altered by the modulation ring. In contrast, the modulation ring does generate a magnetic field ($H_{eddy}>0$) from eddy currents when the modulation ring is switched on (e.g., the switch is closed), which creates a magnetic void between the primary rings and the modulation ring. The magnetic field induced by the eddy currents is in opposition to the magnetic field from the primary rings, thereby lowering the overall magnetic field of the inductive element. As such, the magnetic field strength and, therefore, the inductance of the inductive element are altered by the signal supplied to the modulation ring.

As previously described, different methods can be used to modulate the primary rings of the adjustable inductive elements. In one implementation, the controller circuit 310 can switch the modulation rings on and off individually, providing two different levels of inductance for each inductive element and, therefore, four different RF trapping bandwidths for the RF trap component. The number of different RF trapping bandwidths supported can be more or less than four, depending on the number of modulation rings managed by the controller circuit 310.

In another implementation, the controller circuit 310 can change the PWM of current supplied to the modulation ring of the inductive element to adjust the RF trapping bandwidth of an RF trap component. One or more of the following current parameters may be modified in the current supplied to the modulation ring: the amplitude, the frequency, and the duty cycle. Changes in these current parameters alter the interaction between the modulation ring and the primary rings of the inductive element, thereby altering the permeability of the inductive element and, therefore, the inductive value of the inductive element. Accordingly, the resonance of the resonant LC circuit changes, thereby changing the RF bandwidth trapped by the RF trap component.

Figure 4:
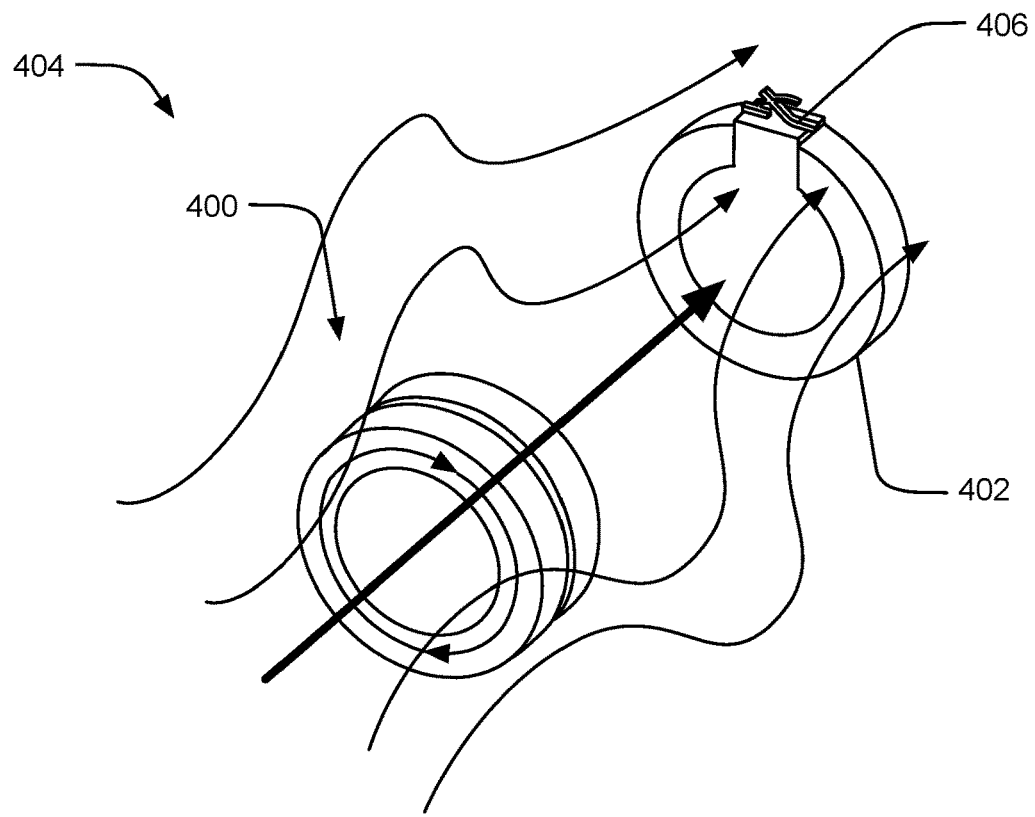
FIG. 4 illustrates example inductance modulation of an inductive element including primary inductive rings and a modulation ring.
Figure 4:
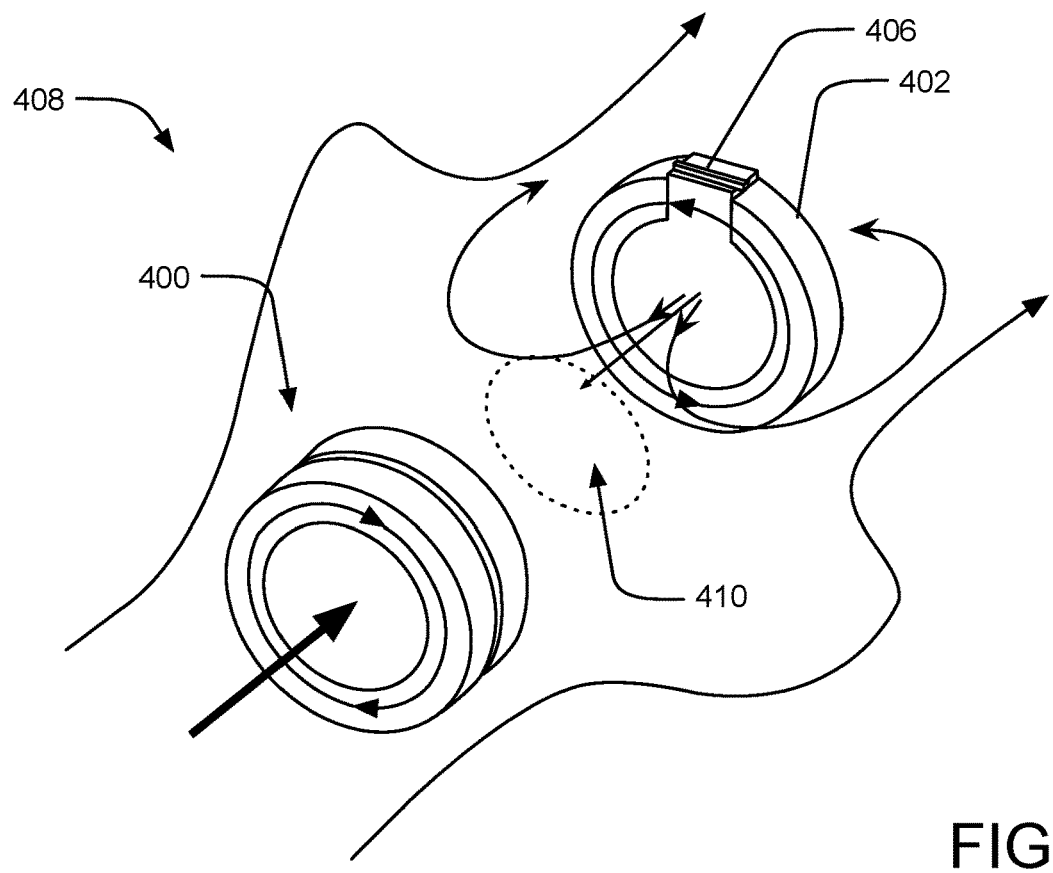

FIG. 4 illustrates example inductance modulation of an inductive element including primary inductive rings 400 and a modulation ring 402. In the view 404, a switch 406 is open such that no current is supplied through the modulation ring 402. Accordingly, there are no substantial eddy currents in the modulation ring 402 to create a magnetic field $H_{eddy}$ to oppose the magnetic field $H_{primary}$ of the primary inductive rings 400. As such, the inductance of the primary inductive rings 400 of the inductive element is not substantially altered by the modulation ring 402.

In the view 408, a switch 406 is closed such that an alternating current is supplied through the modulation ring 402. Accordingly, there are substantial eddy currents in the modulation ring 402 that create a magnetic field $H_{eddy}$ to oppose the magnetic field $H_{primary}$ of the primary inductive rings 400. The opposing magnetic field $H_{eddy}$ creates a magnetic void 410 between the modulation ring 402 and the primary inductive rings 400, which reduces the total magnetic field $H_{total}$ of the inductive element. The reduction of the total magnetic field reduces the effective permeability of the inductive element. As such, the inductance of the primary inductive rings 400 of the inductive element is substantially altered by the modulation ring 402.

Figure 5:
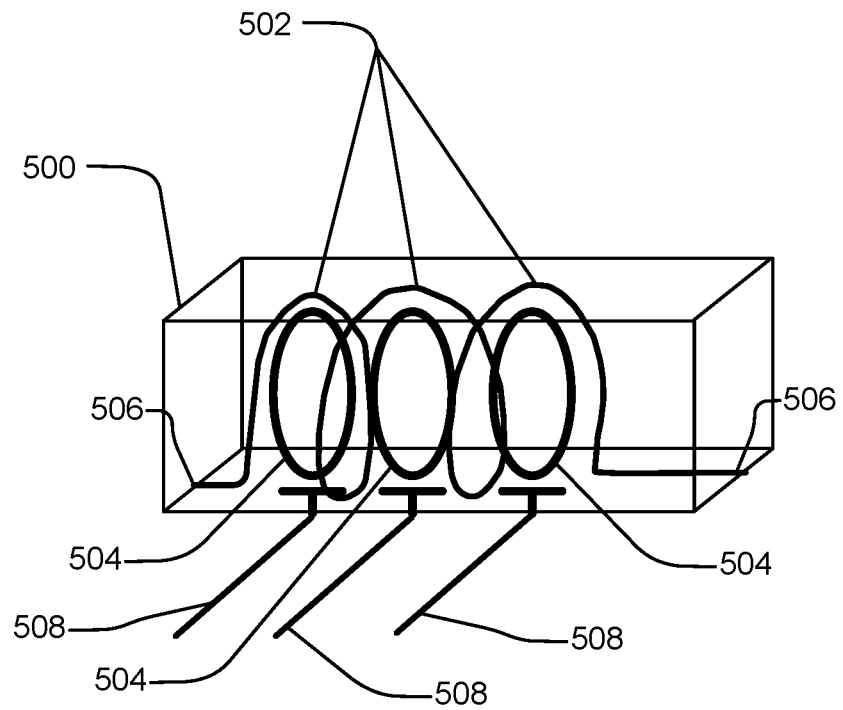
FIG. 5 illustrates an example inductive element including primary inductive rings with modulation rings.

FIG. 5 illustrates an example inductive element 500 including primary inductive rings 502 with modulation rings 504. The inductive element 500 also includes magnetic material, electrical leads 506 to the primary inductive rings 502, and separate leads 508 to the modulation rings 504.

Figure 6:
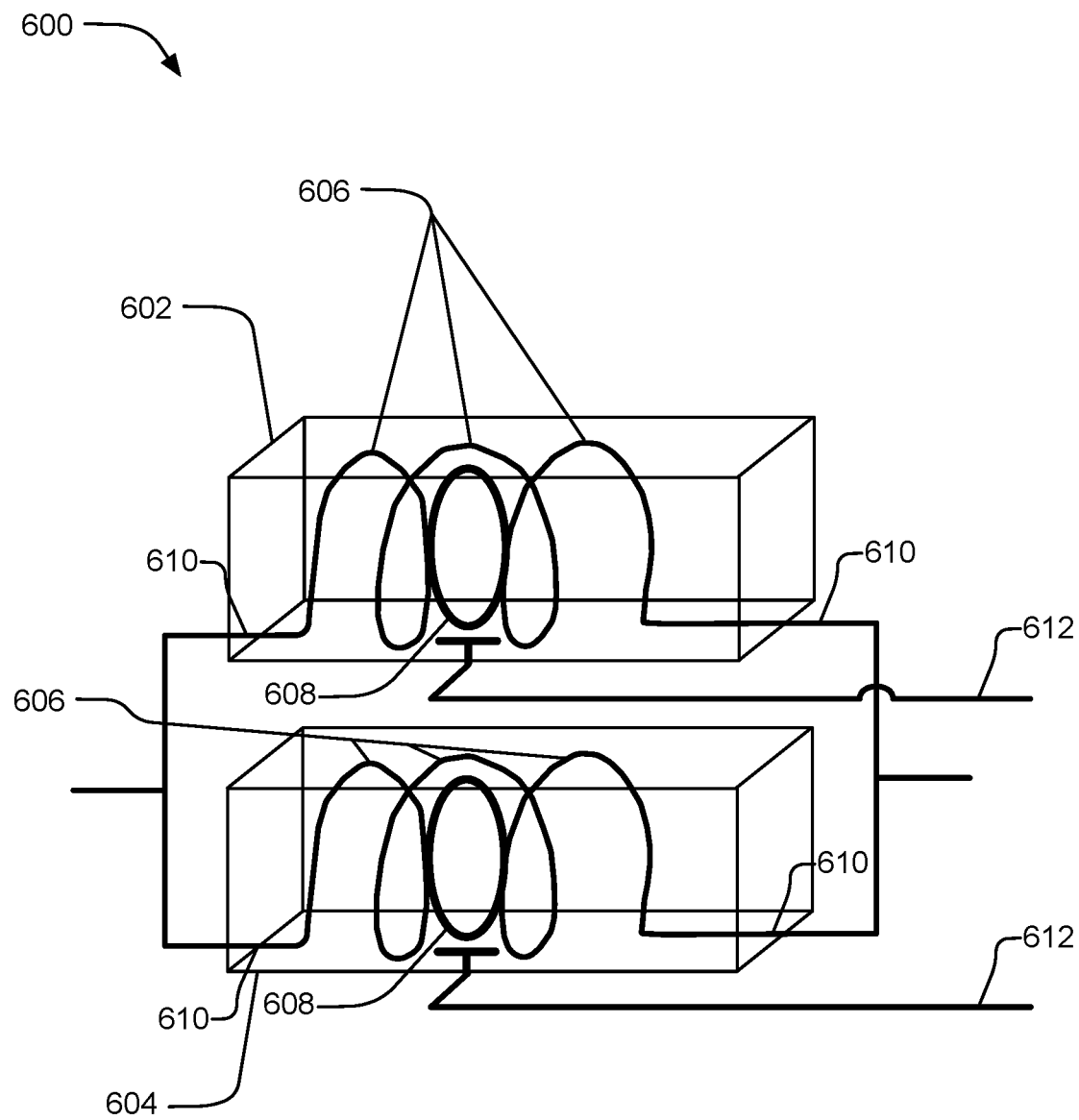
FIG. 6 illustrates another example configuration of two inductive elements connected in parallel and including primary inductive rings and modulation rings.

FIG. 6 illustrates another example configuration 600 of two inductive elements 602 and 604 connected in parallel and including primary inductive rings 606 and modulation rings 608. The inductive elements 602 and 604 also include magnetic material, electrical leads 610 to the primary inductive rings 606, and separate leads 612 to the modulation rings 608.

Figure 7:
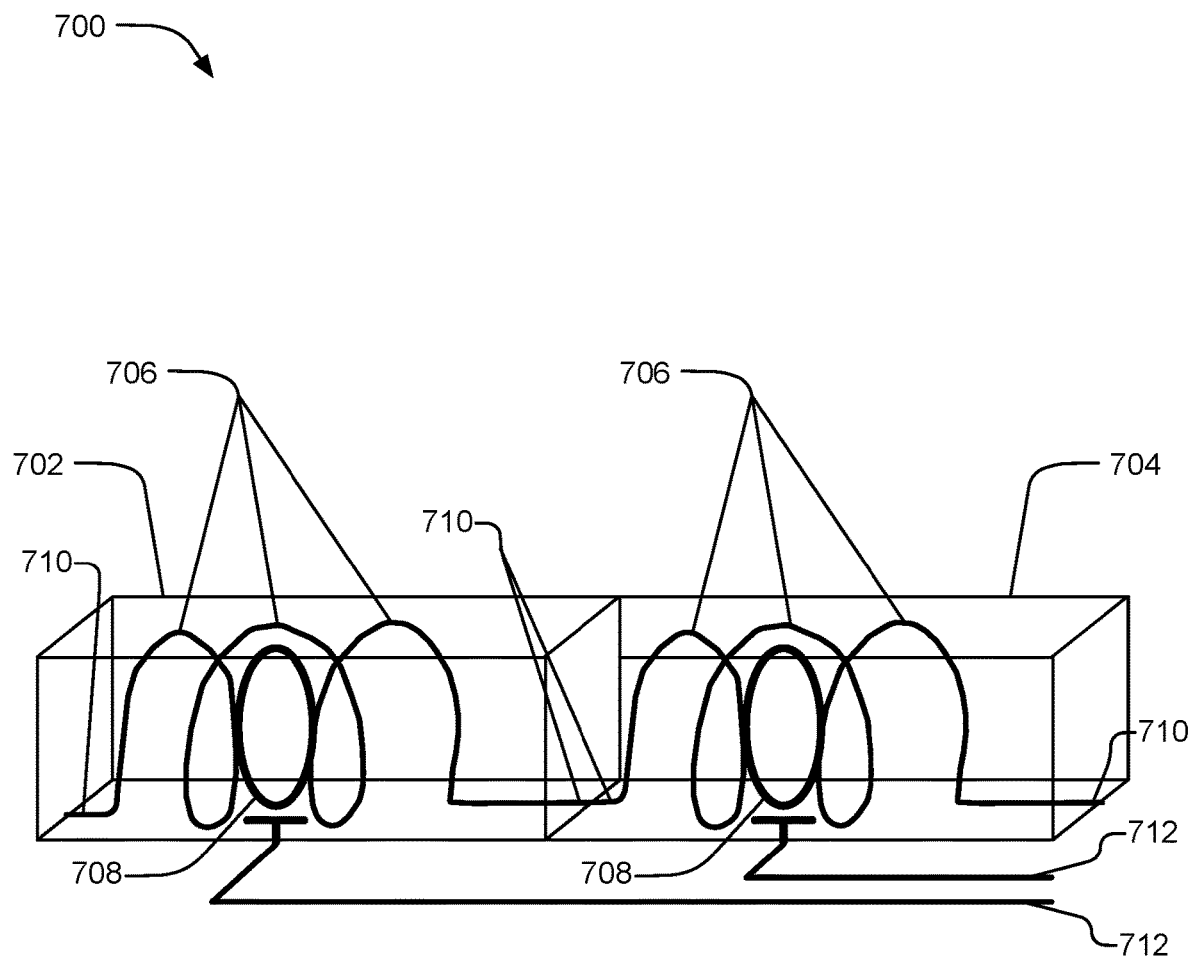
FIG. 7 illustrates yet another example configuration of two inductive elements connected in series and including primary inductive rings and modulation rings.

FIG. 7 illustrates yet another example configuration 700 of two inductive elements 702 and 704 connected in series and including primary inductive rings 706 and modulation rings 708. The inductive elements 702 and 704 also include magnetic material, electrical leads 710 to the primary inductive rings 706, and separate leads 712 to the modulation rings 708.

Figure 8:
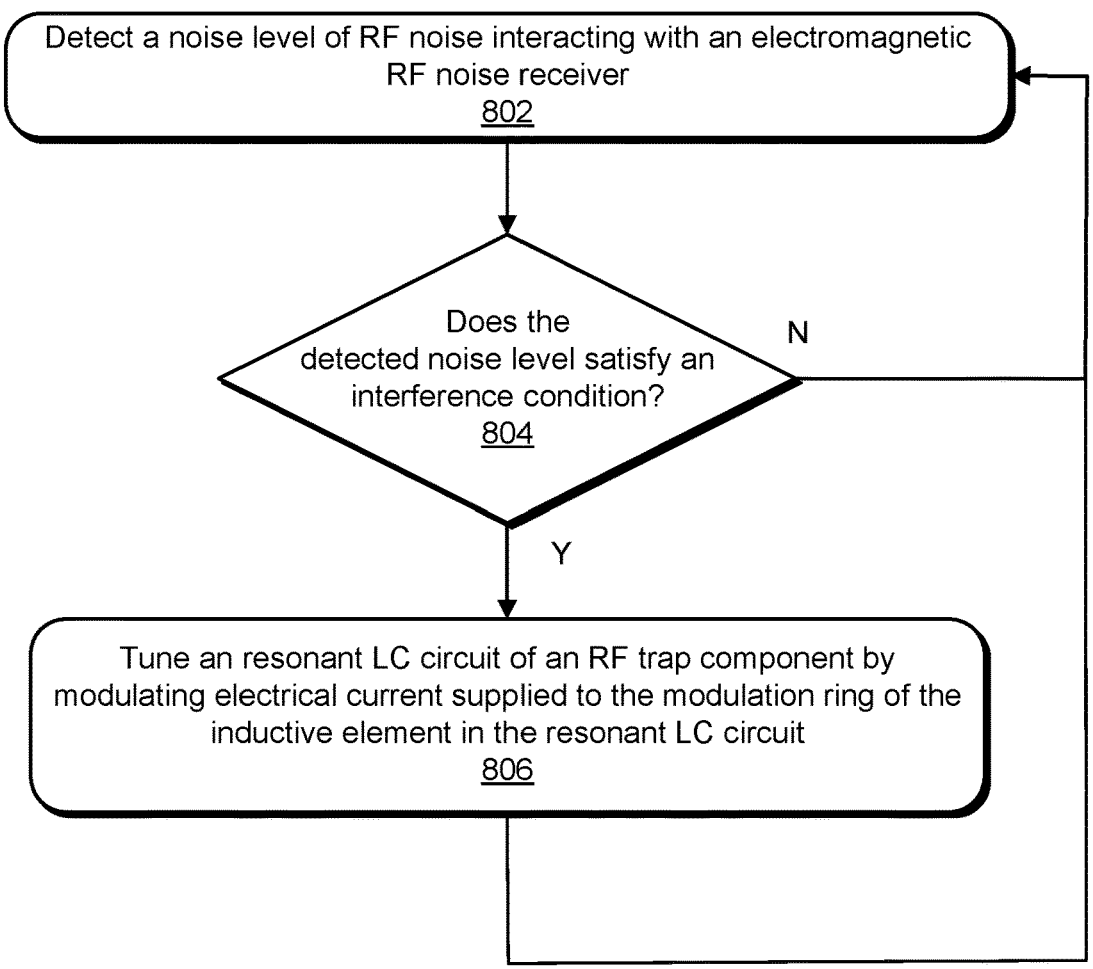
FIG. 8 illustrates example operations dynamically configuring an electromagnetic RF trap component.

FIG. 8 illustrates example operations 800 dynamically configuring an electromagnetic RF trap component. The electromagnetic RF trap component includes at least one resonant LC circuit including at least one capacitive element and at least configurable one inductive element. A detecting operation 802 detects a noise level of radiofrequency noise interacting with an electromagnetic radiofrequency noise recipient in a computing device. The computing device further includes an electromagnetic radiofrequency noise source emitting at least a portion of the radiofrequency noise and a resonant LC circuit including a capacitive element and an inductive element, wherein the inductive element includes primary inductor rings positioned in proximity to a modulation ring.

A testing operation 804 determines whether the detected noise level satisfies an interference condition. If so, a tuning operation 806 tunes a radiofrequency bandwidth at which the resonant LC circuit resonates by modulating electrical current supplied to the modulation ring of the inductive element in the resonant LC circuit, based at least on determining that the detected noise level satisfies the interference condition.

Figure 9:
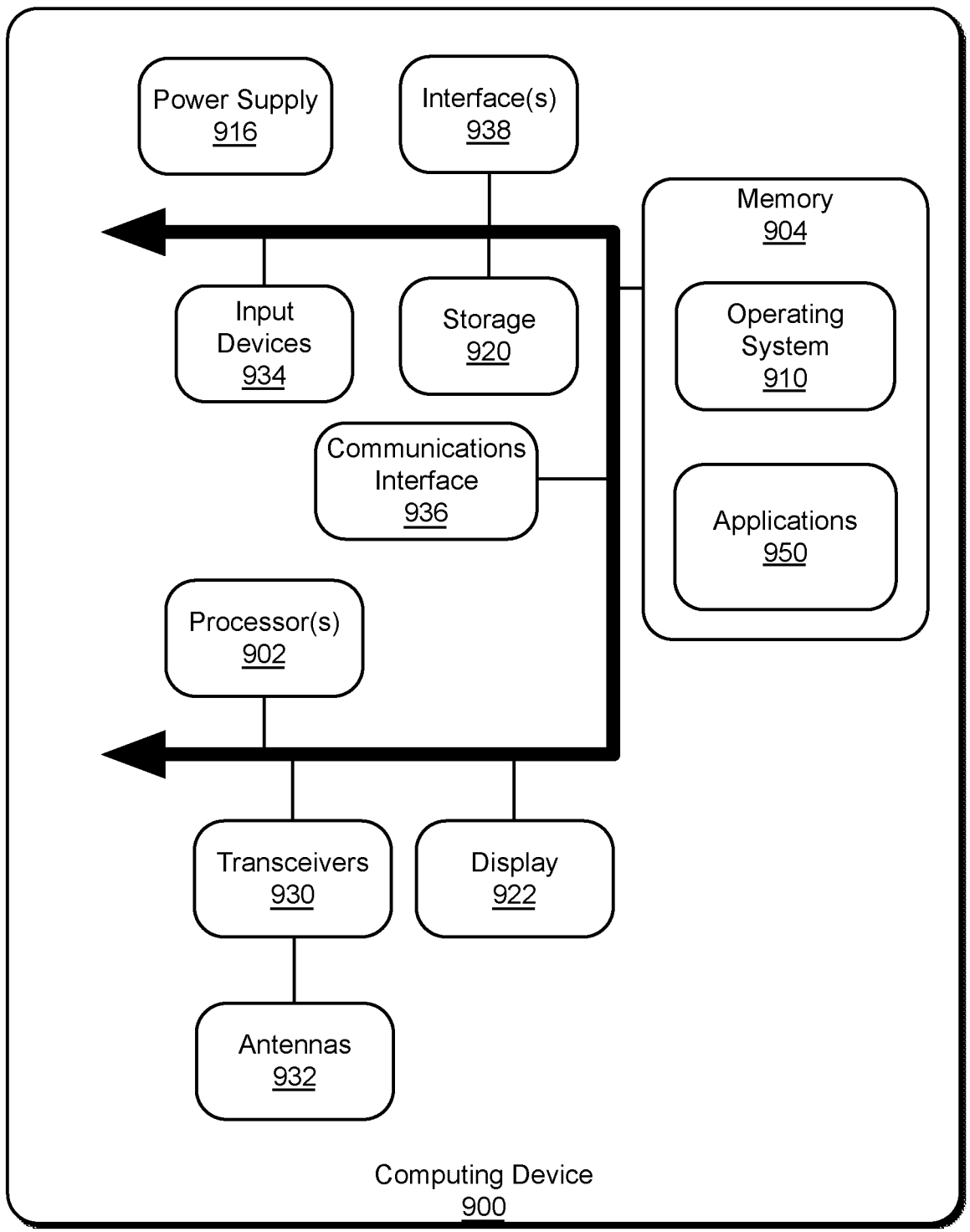
FIG. 9 illustrates an example computing device for use with a configurable electromagnetic RF trap component.

FIG. 9 illustrates an example computing device for use with a dynamically configurable electromagnetic RF trap. The computing device 900 may be a client device, such as a laptop, mobile device, desktop, tablet, or a server/cloud device. The computing device 900 includes one or more processor(s) 902, and a memory 904. The memory 904 generally includes both volatile memory (e.g., RAM) and nonvolatile memory (e.g., flash memory). An operating system 910 resides in the memory 904 and is executed by the processor(s) 902.

In an example computing device 900, as shown in FIG. 9, one or more modules or segments, such as applications 950, software managing the controller circuit and/or the detector circuit, and other program code and modules are loaded into the operating system 910 on the memory 904 and/or storage 920 and executed by processor(s) 902. The storage 920 may store one or more interference conditions, power levels, and other data and be local to the computing device 900 or may be remote and communicatively connected to the computing device 900. In particular, in one implementation, components of the controller circuit and/or the detector circuit may be implemented entirely in hardware or in a combination of hardware circuitry and software.

The computing device 900 includes a power supply 916, which is powered by one or more batteries or other power sources, and which provides power to other components of the computing device 900. The power supply 916 may also be connected to an external power source that overrides or recharges the built-in batteries or other power sources.

The computing device 900 may include one or more communication transceivers 930, which may be connected to one or more antenna(s) 932 to provide network connectivity (e.g., mobile phone network, Wi-Fi®, Bluetooth®) to one or more other servers and/or client devices (e.g., mobile devices, desktop computers, or laptop computers). The computing device 900 may further include a communications interface 936 (such as a network adapter or an I/O port, which are types of communication devices). The computing device 900 may use the adapter and any other types of communication devices for establishing connections over a wide-area network (WAN) or local-area network (LAN). It should be appreciated that the network connections shown are exemplary and that other communications devices and means for establishing a communications link between the computing device 900 and other devices may be used.

The computing device 900 may include one or more input devices 934 such that a user may enter commands and information (e.g., a keyboard or mouse). These and other input devices may be coupled to the server by one or more interfaces 938, such as a serial port interface, parallel port, or universal serial bus (USB). The computing device 900 may further include a display 922, such as a touch screen display.

The computing device 900 may include a variety of tangible processor-readable storage media and intangible processor-readable communication signals. Tangible processor-readable storage can be embodied by any available media that can be accessed by the computing device 900 and can include both volatile and nonvolatile storage media and removable and non-removable storage media. Tangible processor-readable storage media excludes intangible communications signals (such as signals per se) and includes volatile and nonvolatile, removable and non-removable storage media implemented in any method or technology for storage of information such as processor-readable instructions, data structures, program modules, or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage, or other magnetic storage devices, or any other tangible medium which can be used to store the desired information and which can be accessed by the computing device 900. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Some implementations may comprise an article of manufacture. An article of manufacture may comprise a tangible storage medium to store logic. Examples of a storage medium may include one or more types of computer-readable storage media capable of storing electronic data, including volatile memory or nonvolatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described embodiments. The executable computer program instructions may include any suitable types of code, such as source code, compiled code, interpreted code, executable code, static code, dynamic code, and the like. The executable computer program instructions may be implemented according to a predefined computer language, manner, or syntax, for instructing a computer to perform a certain operation segment. The instructions may be implemented using any suitable high-level, low-level, object-oriented, visual, compiled, and/or interpreted programming language.

In some aspects, the techniques described herein relate to a method including: detecting a noise level of radiofrequency noise interacting with an electromagnetic radiofrequency noise recipient in a computing device, wherein the computing device further includes an electromagnetic radiofrequency noise source emitting at least a portion of the radiofrequency noise and a resonant circuit including a capacitive element and an inductive element, wherein the inductive element includes primary inductor rings positioned in proximity to a modulation ring; determining that the detected noise level satisfies an interference condition; and tuning a radiofrequency bandwidth at which the resonant circuit resonates by modulating electrical current supplied to the modulation ring of the inductive element in the resonant circuit, based at least on determining that the detected noise level satisfies the interference condition. One or more technical benefits of the described aspect include reduction in negative performance effects on an RF noise recipient.

In some aspects, the techniques described herein relate to a method, wherein the resonant circuit is positioned between the electromagnetic radiofrequency noise source and the electromagnetic radiofrequency noise recipient in the computing device. One or more technical benefits of the described aspect include reduction in negative performance effects on an RF noise recipient.

In some aspects, the techniques described herein relate to a method, wherein the resonant circuit is positioned within a region of less than 3 db drop off in the radiofrequency noise from the electromagnetic radiofrequency noise source. One or more technical benefits of the described aspect include reduction in negative performance effects on an RF noise recipient.

In some aspects, the techniques described herein relate to a method, further including: detecting a change in the noise level of the radiofrequency noise interacting with the electromagnetic radiofrequency noise recipient in the computing device; determining that the changed noise level satisfies the interference condition, based at least in part on the operation of detecting the change; and tuning the resonant circuit to resonate in a different radiofrequency bandwidth by changing modulation of the electrical current supplied to the modulation ring of the inductive element in the resonant circuit, based at least on determining that the changed noise level satisfies the interference condition. One or more technical benefits of the described aspect include reduction in negative performance effects on an RF noise recipient.

In some aspects, the techniques described herein relate to a method, wherein modulating the electrical current supplied to the modulation ring of the inductive element includes: supplying an alternating current to the modulation ring of the inductive element. One or more technical benefits of the described aspect include reduction in negative performance effects on an RF noise recipient.

In some aspects, the techniques described herein relate to a method, wherein modulating the electrical current supplied to the modulation ring of the inductive element includes: removing an alternating current from the modulation ring of the inductive element. One or more technical benefits of the described aspect include reduction in negative performance effects on an RF noise recipient.

In some aspects, the techniques described herein relate to a method, wherein modulating the electrical current supplied to the modulation ring of the inductive element includes: changing pulse-width-modulation of an alternating current supplied to the modulation ring of the inductive element. One or more technical benefits of the described aspect include reduction in negative performance effects on an RF noise recipient.

In some aspects, the techniques described herein relate to a radiofrequency trap component system including: a resonant circuit including a capacitive element and an inductive element, wherein the inductive element includes primary inductor rings positioned in proximity to a modulation ring; a radiofrequency noise detector configured to detect a noise level of radiofrequency noise interacting with an electromagnetic radiofrequency noise recipient in a computing device; and controller circuitry communicatively coupled to the radiofrequency noise detector and configured to determine that the detected noise level satisfies an interference condition and to tune a radiofrequency bandwidth at which the resonant circuit resonates by modulating electrical current supplied to the modulation ring of the inductive element in the resonant circuit, based at least on determination that the detected noise level satisfies the interference condition.

In some aspects, the techniques described herein relate to a radiofrequency trap component system, wherein the computing device includes an electromagnetic radiofrequency noise source and the resonant circuit is positioned between the electromagnetic radiofrequency noise source and the electromagnetic radiofrequency noise recipient in the computing device.

In some aspects, the techniques described herein relate to a radiofrequency trap component system, wherein the computing device includes an electromagnetic radiofrequency noise source and the resonant circuit is positioned within a region of less than 3 db drop off in the radiofrequency noise from the electromagnetic radiofrequency noise source.

In some aspects, the techniques described herein relate to a radiofrequency trap component system, wherein the controller circuitry is further configured to detect a change in the noise level of the radiofrequency noise interacting with the electromagnetic radiofrequency noise recipient in the computing device, determine that the changed noise level satisfies the interference condition, based at least in part on detection of the change, and tune the resonant circuit to resonate in a different radiofrequency bandwidth by changing modulation of the electrical current supplied to the modulation ring of the inductive element in the resonant circuit, based at least on determination that the changed noise level satisfies the interference condition.

In some aspects, the techniques described herein relate to a radiofrequency trap component system, wherein modulation of the electrical current supplied to the modulation ring of the inductive element includes supply of an alternating current to the modulation ring of the inductive element.

In some aspects, the techniques described herein relate to a radiofrequency trap component system, wherein modulation of the electrical current supplied to the modulation ring of the inductive element includes removal of an alternating current from the modulation ring of the inductive element.

In some aspects, the techniques described herein relate to a radiofrequency trap component system, wherein modulation of the electrical current supplied to the modulation ring of the inductive element includes a change in pulse-width-modulation of an alternating current supplied to the modulation ring of the inductive element.

In some aspects, the techniques described herein relate to one or more tangible processor-readable storage media embodied with instructions for executing on one or more processors and circuits of a computing device a process, the process including: detecting a noise level of radiofrequency noise interacting with an electromagnetic radiofrequency noise recipient in the computing device, wherein the computing device further includes an electromagnetic radiofrequency noise source emitting at least a portion of the radiofrequency noise and a resonant LC circuit including a capacitive element and an inductive element, wherein the inductive element includes primary inductor rings and a modulation ring; determining that the detected noise level satisfies an interference condition; and tuning a radiofrequency bandwidth at which the resonant LC circuit resonates by modulating electrical current supplied to the modulation ring of the inductive element in the resonant LC circuit, based at least on determining that the detected noise level satisfies the interference condition.

In some aspects, the techniques described herein relate to one or more tangible processor-readable storage media, wherein the resonant LC circuit is positioned between the electromagnetic radiofrequency noise source and an electromagnetic radiofrequency noise recipient in the computing device.

In some aspects, the techniques described herein relate to one or more tangible processor-readable storage media, wherein the resonant LC circuit is positioned within a region of less than 3 db drop off in the radiofrequency noise from the electromagnetic radiofrequency noise source.

In some aspects, the techniques described herein relate to one or more tangible processor-readable storage media, further including: detecting a change in the noise level of the radiofrequency noise interacting with the electromagnetic radiofrequency noise recipient in the computing device; determining that the changed noise level satisfies the interference condition, based at least in part on the operation of detecting the change; and tuning the resonant LC circuit to resonate in a different radiofrequency bandwidth by changing modulation of the electrical current supplied to the modulation ring of the inductive element in the resonant LC circuit, based at least on determining that the changed noise level satisfies the interference condition.

In some aspects, the techniques described herein relate to one or more tangible processor-readable storage media, wherein modulating the electrical current supplied to the modulation ring of the inductive element includes: changing an alternating current supplied the modulation ring of the inductive element.

In some aspects, the techniques described herein relate to one or more tangible processor-readable storage media, wherein modulating the electrical current supplied to the modulation ring of the inductive element includes: changing pulse-width-modulation of an alternating current supplied to the modulation ring of the inductive element.

In some aspects, the techniques described herein relate to a system including: means for detecting a noise level of radiofrequency noise interacting with an electromagnetic radiofrequency noise recipient in a computing device, wherein the computing device further includes an electromagnetic radiofrequency noise source emitting at least a portion of the radiofrequency noise and a resonant circuit including a capacitive element and an inductive element, wherein the inductive element includes primary inductor rings positioned in proximity to a modulation ring; means for determining that the detected noise level satisfies an interference condition; and means for tuning a radiofrequency bandwidth at which the resonant circuit resonates by modulating electrical current supplied to the modulation ring of the inductive element in the resonant circuit, based at least on determining that the detected noise level satisfies the interference condition.

In some aspects, the techniques described herein relate to a system, wherein the resonant circuit is positioned between the electromagnetic radiofrequency noise source and the electromagnetic radiofrequency noise recipient in the computing device.

In some aspects, the techniques described herein relate to a system, wherein the resonant circuit is positioned within a region of less than 3 db drop off in the radiofrequency noise from the electromagnetic radiofrequency noise source.

In some aspects, the techniques described herein relate to a system, further including: means for detecting a change in the noise level of the radiofrequency noise interacting with the electromagnetic radiofrequency noise recipient in the computing device; means for determining that the changed noise level satisfies the interference condition, based at least in part on the operation of detecting the change; and means for tuning the resonant circuit to resonate in a different radiofrequency bandwidth by changing modulation of the electrical current supplied to the modulation ring of the inductive element in the resonant circuit, based at least on determining that the changed noise level satisfies the interference condition.

In some aspects, the techniques described herein relate to a system, wherein modulating the electrical current supplied to the modulation ring of the inductive element includes: supplying an alternating current to the modulation ring of the inductive element.

In some aspects, the techniques described herein relate to a system, wherein modulating the electrical current supplied to the modulation ring of the inductive element includes: removing an alternating current from the modulation ring of the inductive element.

In some aspects, the techniques described herein relate to a system, wherein modulating the electrical current supplied to the modulation ring of the inductive element includes: changing pulse-width-modulation of an alternating current supplied to the modulation ring of the inductive element.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

What is claimed is:

1. A method comprising:
   detecting a noise level of radiofrequency noise interacting with an electromagnetic radiofrequency noise recipient in a computing device, wherein the computing device further includes an electromagnetic radiofrequency noise source emitting at least a portion of the radiofrequency noise and a resonant circuit including a capacitive element and an inductive element, wherein the inductive element includes primary inductor rings positioned in proximity to a modulation ring;
   determining that the detected noise level satisfies an interference condition; and
   tuning a radiofrequency bandwidth at which the resonant circuit resonates by modulating electrical current supplied to the modulation ring of the inductive element in the resonant circuit, based at least on determining that the detected noise level satisfies the interference condition.

2. The method of claim 1, wherein the resonant circuit is positioned between the electromagnetic radiofrequency noise source and the electromagnetic radiofrequency noise recipient in the computing device.

3. The method of claim 1, wherein the resonant circuit is positioned within a region of less than 3db drop off in the radiofrequency noise from the electromagnetic radiofrequency noise source.

4. The method of claim 1, further comprising:
   detecting a change in the noise level of the radiofrequency noise interacting with the electromagnetic radiofrequency noise recipient in the computing device;
   determining that the changed noise level satisfies the interference condition, based at least in part on the operation of detecting the change; and
   tuning the resonant circuit to resonate in a different radiofrequency bandwidth by changing modulation of the electrical current supplied to the modulation ring of the inductive element in the resonant circuit, based at least on determining that the changed noise level satisfies the interference condition.

5. The method of claim 1, wherein modulating the electrical current supplied to the modulation ring of the inductive element comprises:
   supplying an alternating current to the modulation ring of the inductive element.

6. The method of claim 1, wherein modulating the electrical current supplied to the modulation ring of the inductive element comprises:
   removing an alternating current from the modulation ring of the inductive element.

7. The method of claim 1, wherein modulating the electrical current supplied to the modulation ring of the inductive element comprises:
   changing pulse-width-modulation of an alternating current supplied to the modulation ring of the inductive element.

8. A radiofrequency trap component system comprising:
   a resonant circuit including a capacitive element and an inductive element, wherein the inductive element includes primary inductor rings positioned in proximity to a modulation ring;
   a radiofrequency noise detector configured to detect a noise level of radiofrequency noise interacting with an electromagnetic radiofrequency noise recipient in a computing device; and
   controller circuitry communicatively coupled to the radiofrequency noise detector and configured to determine that the detected noise level satisfies an interference condition and to tune a radiofrequency bandwidth at which the resonant circuit resonates by modulating electrical current supplied to the modulation ring of the inductive element in the resonant circuit, based at least on determination that the detected noise level satisfies the interference condition.

9. The radiofrequency trap component system of claim 8, wherein the computing device includes an electromagnetic radiofrequency noise source and the resonant circuit is positioned between the electromagnetic radiofrequency noise source and the electromagnetic radiofrequency noise recipient in the computing device.

10. The radiofrequency trap component system of claim 8, wherein the computing device includes an electromagnetic radiofrequency noise source and the resonant circuit is positioned within a region of less than 3db drop off in the radiofrequency noise from the electromagnetic radiofrequency noise source.

11. The radiofrequency trap component system of claim 8, wherein the controller circuitry is further configured to detect a change in the noise level of the radiofrequency noise interacting with the electromagnetic radiofrequency noise recipient in the computing device, determine that the changed noise level satisfies the interference condition, based at least in part on detection of the change, and tune the resonant circuit to resonate in a different radiofrequency bandwidth by changing modulation of the electrical current supplied to the modulation ring of the inductive element in the resonant circuit, based at least on determination that the changed noise level satisfies the interference condition.

12. The radiofrequency trap component system of claim 8, wherein modulation of the electrical current supplied to the modulation ring of the inductive element comprises supply of an alternating current to the modulation ring of the inductive element.

13. The radiofrequency trap component system of claim 8, wherein modulation of the electrical current supplied to the modulation ring of the inductive element comprises removal of an alternating current from the modulation ring of the inductive element.

14. The radiofrequency trap component system of claim 8, wherein modulation of the electrical current supplied to the modulation ring of the inductive element comprises a change in pulse-width-modulation of an alternating current supplied to the modulation ring of the inductive element.

15. One or more tangible processor-readable storage media embodied with instructions for executing on one or more processors and circuits of a computing device a process, the process comprising:
  detecting a noise level of radiofrequency noise interacting with an electromagnetic radiofrequency noise recipient in the computing device, wherein the computing device further includes an electromagnetic radiofrequency noise source emitting at least a portion of the radiofrequency noise and a resonant LC circuit including a capacitive element and an inductive element, wherein the inductive element includes primary inductor rings and a modulation ring;
  determining that the detected noise level satisfies an interference condition; and
  tuning a radiofrequency bandwidth at which the resonant LC circuit resonates by modulating electrical current supplied to the modulation ring of the inductive element in the resonant LC circuit, based at least on determining that the detected noise level satisfies the interference condition.

16. The one or more tangible processor-readable storage media of claim 15, wherein the resonant LC circuit is positioned between the electromagnetic radiofrequency noise source and an electromagnetic radiofrequency noise recipient in the computing device.

17. The one or more tangible processor-readable storage media of claim 15, wherein the resonant LC circuit is positioned within a region of less than 3db drop off in the radiofrequency noise from the electromagnetic radiofrequency noise source.

18. The one or more tangible processor-readable storage media of claim 15, further comprising:
  detecting a change in the noise level of the radiofrequency noise interacting with the electromagnetic radiofrequency noise recipient in the computing device;
  determining that the changed noise level satisfies the interference condition, based at least in part on the operation of detecting the change; and
  tuning the resonant LC circuit to resonate in a different radiofrequency bandwidth by changing modulation of the electrical current supplied to the modulation ring of the inductive element in the resonant LC circuit, based at least on determining that the changed noise level satisfies the interference condition.

19. The one or more tangible processor-readable storage media of claim 15, wherein modulating the electrical current supplied to the modulation ring of the inductive element comprises:
  changing an alternating current supplied the modulation ring of the inductive element.

20. The one or more tangible processor-readable storage media of claim 15, wherein modulating the electrical current supplied to the modulation ring of the inductive element comprises:
  changing pulse-width-modulation of an alternating current supplied to the modulation ring of the inductive element.

\* \* \* \* \*